United States Patent
Pappu et al.

(10) Patent No.: US 9,891,282 B2
(45) Date of Patent: Feb. 13, 2018

(54) CHIP FABRIC INTERCONNECT QUALITY ON SILICON

(71) Applicant: Intel Corporation, Santa Clara, CA (US)

(72) Inventors: Lakshminarayana Pappu, Folsom, CA (US); Robert P. Adler, Santa Clara, CA (US); Suketu U. Bhatt, Folsom, CA (US); Robert De Gruijl, San Francisco, CA (US); Kah Meng Yeem, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/998,200

(22) Filed: Dec. 24, 2015

(65) Prior Publication Data

US 2017/0184666 A1    Jun. 29, 2017

(51) Int. Cl.
*G01R 31/28* (2006.01)
*G01R 31/3177* (2006.01)
*H03K 19/177* (2006.01)
*H03K 19/21* (2006.01)

(52) U.S. Cl.
CPC ... *G01R 31/3177* (2013.01); *H03K 19/17704* (2013.01); *H03K 19/21* (2013.01)

(58) Field of Classification Search
None
See application file for complete search history.

(56) References Cited

U.S. PATENT DOCUMENTS

| 7,506,234 | B2 | 3/2009 | Lee et al. | |
|---|---|---|---|---|
| 9,189,439 | B2 | 11/2015 | Rachakonda et al. | |
| 2002/0138801 | A1* | 9/2002 | Wang | G01R 31/31704 714/729 |
| 2004/0068684 | A1* | 4/2004 | Huang | G11C 29/56012 714/718 |
| 2004/0153926 | A1* | 8/2004 | Abdel-Hafez | G01R 31/318385 714/726 |
| 2004/0268181 | A1* | 12/2004 | Wang | G01R 31/318586 714/30 |
| 2005/0005215 | A1 | 1/2005 | Napolitano | |
| 2005/0268194 | A1* | 12/2005 | Wang | G01R 31/318547 714/733 |
| 2007/0011535 | A1* | 1/2007 | Anzou | G11C 29/40 714/733 |

(Continued)

OTHER PUBLICATIONS

International Search Report and Written Opinion for International Application No. PCT/US16/63122 dated Mar. 3, 2017.

*Primary Examiner* — Daniel McMahon
(74) *Attorney, Agent, or Firm* — Green, Howard & Mughal LLP

(57) ABSTRACT

Described is a signature accumulator with a first set of logic devices, a second set of logic devices, and a memory device. The first set of logic devices includes compaction logic that couples an N-bit input bus to a K-bit first intermediate bus. The second set of logic devices includes commutative arithmetic operation logic that couples both the K-bit first intermediate bus and a K-bit signature bus to a K-bit second intermediate bus. The memory storage device includes a storage element that couples the K-bit second intermediate bus to the K-bit signature bus. The K-bit signature bus is also coupled to a valid-data input signal path.

20 Claims, 12 Drawing Sheets

(56) References Cited

U.S. PATENT DOCUMENTS

2007/0260950 A1 11/2007 Morrison et al.
2009/0089636 A1* 4/2009 Fernsler .............. G06F 11/2242
 714/728
2010/0257417 A1 10/2010 Rajski et al.

* cited by examiner

CHIP FABRIC INTERCONNECT QUALITY ON SILICON

BACKGROUND

Silicon components are typically tested after being manufactured in order to ensure functionality and quality. Testing of silicon components in production lines is sometimes called HVM (High-Volume Manufacturing) testing. One type of HVM testing, "sort" testing, may be performed on components that are unpackaged and still exist as die on a manufactured silicon wafer. Another type of HVM testing, "class" testing, may be performed on components that exist as die that have been cut from a manufactured silicon wafer and subsequently packaged for potential sale to customers.

HVM testers—i.e., the machines used to perform HVM tests—are complex and expensive. As a result, the amount of time required to test a component on an HVM tester may contribute significantly to the cost required to manufacture the component. There is accordingly a tension between testing components to ensure their functionality and quality, and limiting the time required to perform the testing on HVM testers.

A variety of types of HVM tests may be performed on a component at sort testing, at class testing, or both. These tests may use a variety of DFT (Design for Test) and DFM (Design for Manufacturability) features of the component which are designed to maximize the comprehensiveness of the tests while minimizing the time required to perform the tests.

For example, a particular circuit or feature of the component such as a Random-Access Memory (RAM) might be designed to include Built-In Self Test (BIST) circuitry which may be activated to perform relatively rapid and/or comprehensive testing of the circuit or feature. As another example, for components with substantial portions implemented through a mix of combinational logic and sequential logic, the elementary units of the sequential logic (e.g. shift registers) may be designed to accommodate "scan" inputs and "scan" outputs, which are auxiliary inputs and outputs of the shift registers. The scan output of one register may then be connected to the scan input of another register, and so on, and one or more "scan chains" of registers may thereby be formed on the component. Once formed, an HVM test may load the scan chains with an arbitrary sequence of values, then apply one clock cycle to the shift registers. Such scan tests will in turn exercise some portion of the combinational logic.

Another type of test that may be applied to a component are functional tests. Under a functional test, the component may be subjected to stimulus of the sort it would experience in actual working conditions. The response of the component to the stimulus may then be compared to the expected response of the component to that stimulus. Functional tests may help to improve test coverage achieved by DFT and DFM tests such as BIST testing or scan testing. In other words, if the suite of DFT-based tests and DFM-based tests do not cover certain portions of the design, then functional tests may be written to cover those previously-uncovered design portions.

BRIEF DESCRIPTION OF THE DRAWINGS

The embodiments of the disclosure will be understood more fully from the detailed description given below and from the accompanying drawings of various embodiments of the disclosure. However, while the drawings are to aid in explanation and understanding, they are only an aid, and should not be taken to limit the disclosure to the specific embodiments depicted therein.

DETAILED DESCRIPTION

Figure 1:
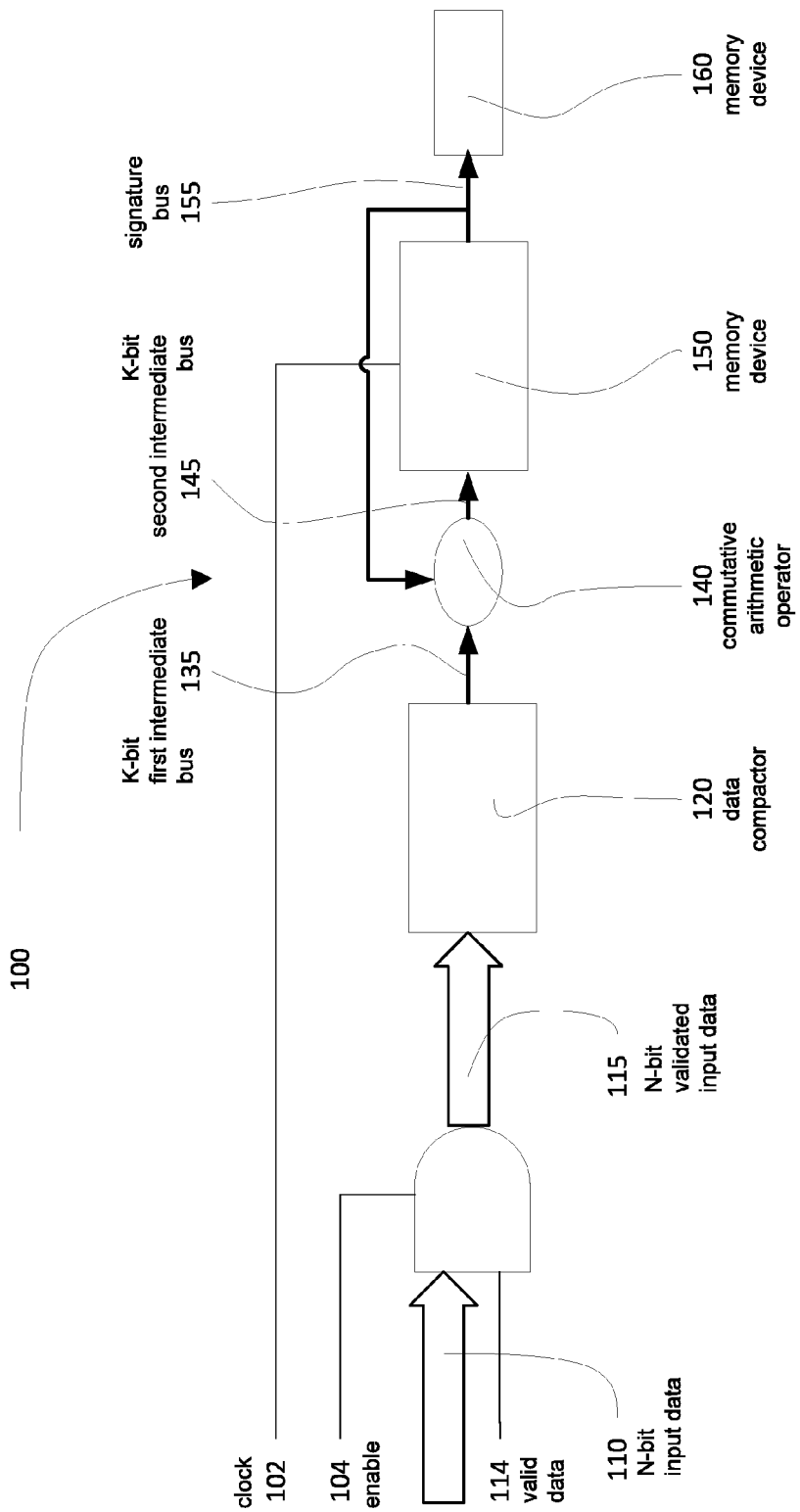
FIG. 1 illustrates a block diagram of a signature accumulator, according to some embodiments of the disclosure.

HVM tests rely heavily upon the deterministic response of a component to a stimulus applied to it. Components are typically deemed to fail if they do not respond in the manner that a particular HVM test indicates that they should respond—and, crucially, at the time that the HVM test indicates that they should respond.

Meanwhile, for flexibility in view of factors such as cost and development time, component designs have increasingly come to embrace SoC (System-on-a-Chip) design methodologies. Some SoC components may be designed to incorporate IP (Intellectual Property) cores, as well as fabrics interconnecting the IP cores, for purposes of flexibility. For some components, on-die fabrics including interconnect between various ports may extend over a very large portion of the physical component, and may be subject to a correspondingly large portion of the potential defects or faults of the component. However, SoC design methodologies may be prone to nondeterministic performance on HVM testers. Some IP cores on a component may use one clock while other IP cores on the component use another clock, for example, and it may be difficult to establish those clocks in an HVM test environment in such a way that would lead to deterministic behavior.

In order to flexibly accommodate SoC design methodologies, signature accumulators can sample values along various datapaths within a design. These signature accumulators can accumulate a signature that is a function of the entire history of the traffic on the datapath, and that signature can be independent of the order in which the traffic has been sent on the datapath.

As a result, functional HVM test patterns may be used to subject a component having such a signature accumulator to very high levels of traffic, and the signature accumulator will be able to indicate proper functionality for the design even if nondeterministic behavior on the HVM tester results in the traffic passing through the datapath in a nondeterministic order. Functional HVM tests may thereby exercise and cover very extensive portions of the potential "faults" within the component. Those faults may be particularly valuable to cover, since they may correspond to faults that are most easily exercised in normal operation.

In the following description, numerous details are discussed to provide a more thorough explanation of embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical, mechanical, or magnetic connection between the things that are connected, without any intermediary devices. The term "coupled" means either a direct electrical, mechanical, or magnetic connection between the things that are connected or an indirect connection through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about" generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking, or in any other manner.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

FIG. 1 illustrates a signature accumulator 100, according to some embodiments of the disclosure. Signature accumulator 100 has several inputs, including a clock 102, an enable 104, an N-bit input data 110, and a valid data indicator 114. As will be discussed further below, input data 110 may be connected to a datapath on a component, such as a datapath on a sideband fabric or a primary fabric.

Enable 104 is set to '1' when signature accumulator 100 is enabled (which may be due to a "global trigger" sent to many signature accumulators on the same component). Valid data indicator 114 is set to '1' when N-bit input data 110 is deemed to be valid data that signature accumulator 100 should account for (and in particular when input data 110 does not have any 'X' or indeterminate data).

Beyond input data 110 is an N-bit validated input data 115. In FIG. 1, the progress of data being inputted to signature accumulator 100 is made conditional upon both enable 104 and valid data indicator 114. Accordingly, when enable 104 and valid data indicator 114 are both set to '1,' the value on input data 110 is passed to validated input data 115; otherwise, the bits of validated input data 115 are set to '0.'

Validated input data 115 is then passed to a data compactor 120, which compacts N-bit validated input data 115 and passes the result to a K-bit first intermediate bus 135. In general, that compaction may take any form in which each of the K bits of first intermediate bus 135 is related by some Boolean function to one or more of the N bits of validated input data 115. Data compactor 120 may accordingly compact the N bits of validated input data 115 into the K bits of first intermediate bus 135 in a wide variety of ways. For example, data compactor 120 may set each of the K bits of first intermediate bus 135 to the evaluation of either an "OR" function or an "AND" function with respect to two or more of the N bits of validated input data 115. In other embodiments, data compactor 120 may set each of the K bits of first intermediate bus 135 to the evaluation of any Boolean function with respect to any of the N bits of validated input data 115.

Figure 3:
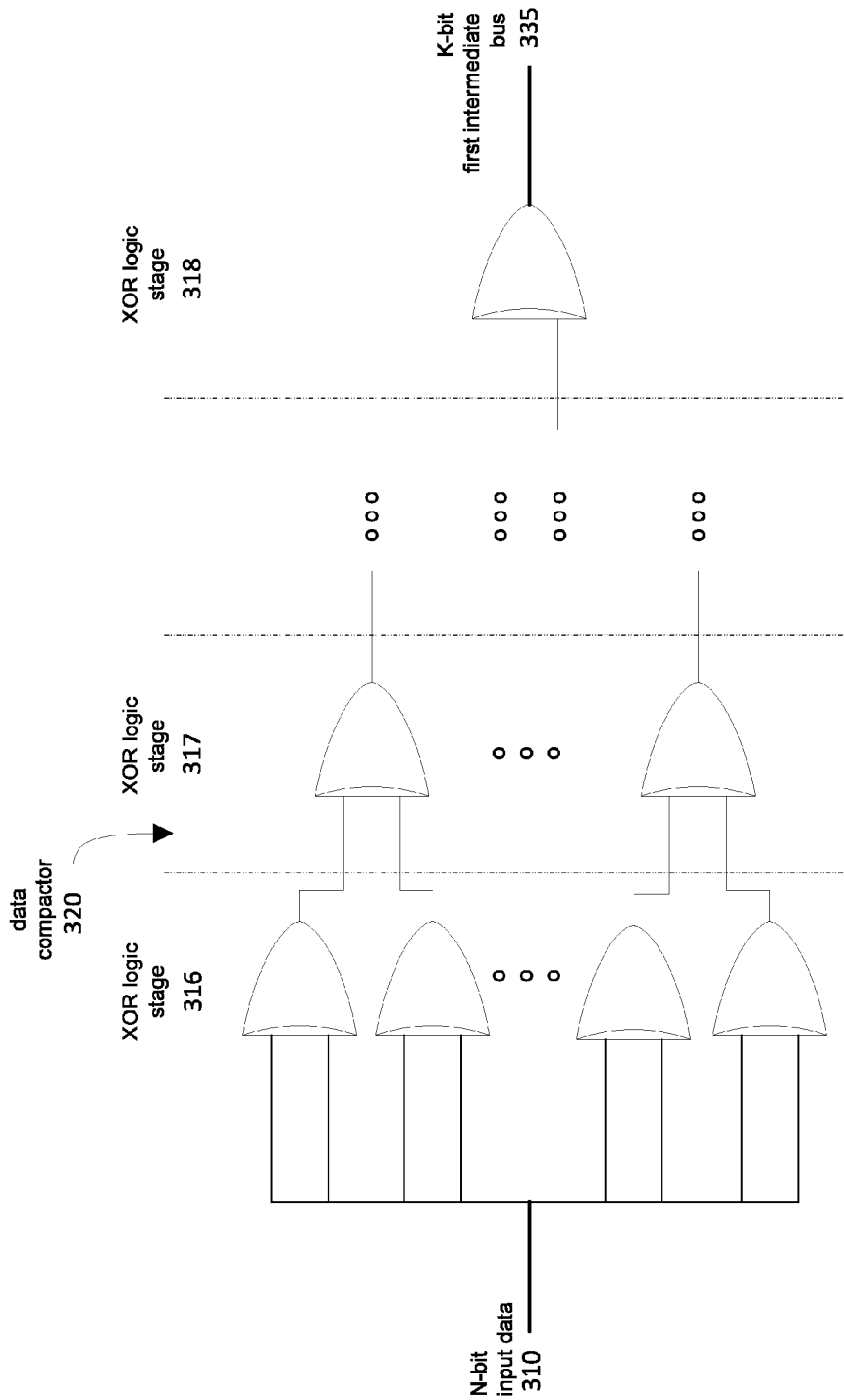
FIG. 3 illustrates a diagram of a data compactor, according to some embodiments of the disclosure.

In some embodiments, data compactor 120 may compact input data 115 using a tree of XOR logic. By way of example, FIG. 3 illustrates a data compactor according to some embodiments of the disclosure. Data compactor 320 uses XOR tree logic to compact an N-bit input data 310 and pass the results to a K-bit first intermediate bus 335.

Data compactor 320 includes a number S of stages of XOR logic, beginning with stage 316 (i.e., stage 1 out of S), then proceeding to stage 317 (stage 2 out of S), and so on, to stage 318 (stage S out of S). More generally, in various embodiments, data compactor 320 may have an N-bit input, a K-bit output, and a number of stages S, where N, K, and S have the following relationship to each other:

$$N=K*2^S$$

Accordingly, the ratio of N to K is a power of two.

In various embodiments, N could be 8, 16, 32, 64, or 128, and K could be chosen to require a suitably low amount of implementing logic. For a primary fabric, for example, N might be 64 or 128 and K might be 16 whereas for a sideband fabric N might be 16 or 32 and K might be 16.

Each of stages 316-318 includes a number of two-input XOR gates in parallel. An advantage of using a tree of XOR logic is that for random input data, each bit of the K-bit output is as likely to have a '0' value as a '1' value. However, other embodiments of data compactor 320 may include either OR gates or AND gates instead of XOR gates, or may include logic implementing an output related to multiple inputs by any Boolean function. Moreover, while the number of stages S of logic may be greater than one in many embodiments, some embodiments may have only one stage of logic. In addition, other embodiments of data compactor 320 may include two-input gates, three-input gates, or gates with any number of inputs. In such embodiments, N, K, and S have the following relationship to each other (where W indicates the number of inputs per gate):

$$N=K*W^S$$

Returning to FIG. 1, data compactor 120 may be similar to data compactor 320. In other words, data compactor 120 may in some embodiments use an XOR logic tree to compact the N bits of validated input data 115 to the K bits of first intermediate bus 135. The K bits of first intermediate bus 135 are then passed to a commutative arithmetic operator 140, along with a K-bit signature bus 155 (which this discussion will return to shortly). Commutative arithmetic operator 140 performs a commutative arithmetic operation between the value on first intermediate bus 135 and the value on signature bus 155. In some embodiments, the commutative arithmetic operation may be addition. In other embodiments, the operation may be multiplication, or any other commutative arithmetic operation. Commutative arithmetic operator 140 then sets a K-bit second intermediate bus 145 to the result of the commutative arithmetic operation.

Second intermediate bus 145 is then input to a memory device 150, which may include a flip-flop or register, and which incorporates a clock input connected to clock 102 and an output connected to K-bit signature bus 155. Upon a predetermined stimulus on clock 102 (such as a rising edge of clock 102), the value on second intermediate bus 145 is passed onto signature bus 155. Accordingly, signature bus 155 carries the previous value of second intermediate bus 145 (e.g., the value of second intermediate bus 145 at the end of the previous clock cycle). Signature bus 155 may then be passed to a register storage 160, which can capture and preserve a value on signature bus 155 for further use.

As such, either the N-bit data on input data 110 is passed to validated input data 115 (when enable 104 and valid data indicator 114 are both '1'), or '0' is placed on the bits of validated input data 115. Data compactor 120 then compacts the N bits of validated input data 115 onto the K bits of first intermediate bus 135. Commutative arithmetic operator 140 may then, for example, add the value on first intermediate bus 135 to the value on signature bus 155 (which is the value that was on second intermediate bus 145 at the end of the previous clock cycle), then output the result onto second intermediate bus 145. Afterward, memory device 150 may capture the value on second intermediate bus 145 at the end of the current clock cycle and place the value on signature bus 155 on the next clock cycle. The value on signature bus 155 may then be captured by memory device 160.

Once all traffic has passed through the datapath, the value in memory device 160 may be read out during an HVM test (for example, by a Peripheral Component Interconnect (PCI) configuration register read, or other register read) to determine whether all expected transactions passed through the datapath. Since the addition operation (or other arithmetic operation) performed by commutative arithmetic operator 140 is commutative, after all traffic has passed through the datapath connected to input data 110, the value placed on signature bus 155 will be the same regardless of the order in which the traffic passed through the datapath. Actual silicon components may therefore be capable of passing this HVM test, even if the transactions have passed through the datapath in a different order than expected due to non-determinism in the HVM tester environment.

Figure 2:
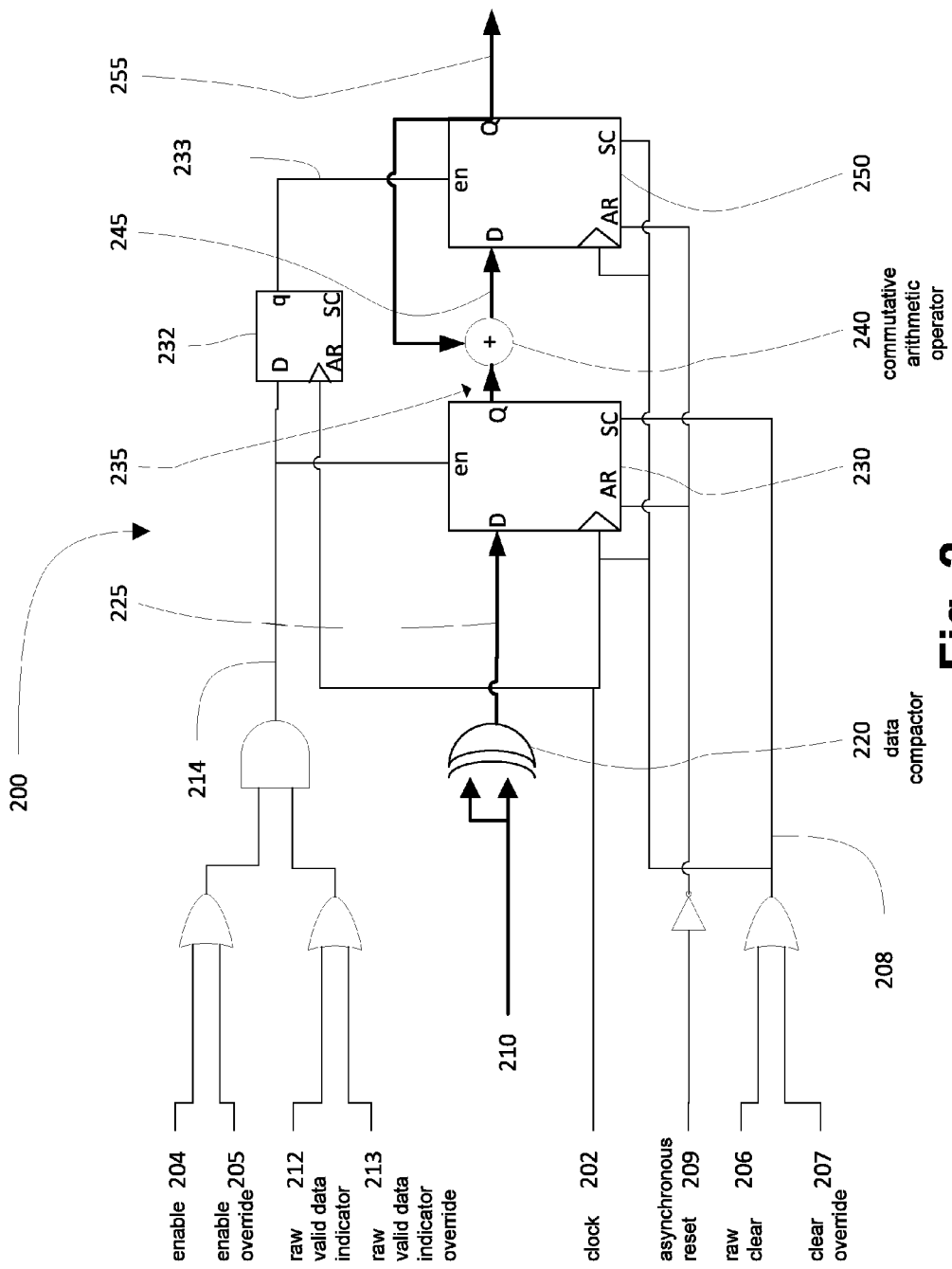
FIG. 2 illustrates a diagram of a signature accumulator, according to some embodiments of the disclosure.

FIG. 2 illustrates a diagram of another signature accumulator, according to some embodiments of the disclosure. A signature accumulator 200 has inputs including a clock 202, an enable 204, an enable override 205, an N-bit input data 210, a raw valid data indicator 212, and a raw valid data indicator override 213. Input data 210 may be connected to a datapath on a component, such as a datapath on a sideband fabric or a primary fabric.

Enable 204 is set to '1' when signature accumulator 200 is enabled (which may be due to a "global trigger" sent to many signature accumulators on the same component). Raw valid data indicator 212 is set to '1' when N-bit input data 210 is deemed to be valid data that signature accumulator 200 should account for (and in particular when input data 210 does not have any 'X' or indeterminate data). In signature accumulator 200, if both enable 204 and raw valid indicator 212 are set to '1,' then a valid data indicator 214 will be set to '1.' However, signature accumulator 200 includes two override inputs for use in causing alternate functionality, such as in a debug mode. Enable override 205, when set, will permit valid data indicator 214 to be set to '1' when enable 204 is not set to '1.' Similarly, raw valid data indicator override 213 will permit valid data indicator 214 to be set to '1' when raw valid data indicator 212 is not set to '1.'

Input data 210 is passed to data compactor 220. Data compactor 220 may be similar to data compactor 320 of FIG. 3. Accordingly, in some embodiments, data compactor 220 may use an XOR logic tree to compact the N bits of input data 210 and place the resulting value on a K-bit additional bus 225.

Additional bus 225 is then input to a memory device 230, which may include a flip-flop or register, and which incorporates a clock input connected to clock 202, an output connected to a K-bit first intermediate bus 235, and an enable input connected to valid data indicator 214. When valid data indicator 214 is '1,' and upon a predetermined stimulus on clock 202 (such as a rising edge of clock 202), the value on additional bus 225 at the end of the previous clock cycle may be passed onto first intermediate bus 235.

Meanwhile, alongside this data path within signature accumulator 200, valid data indicator 214 is also input to an additional memory device 232. Upon a predetermined stimulus on clock 202 (such as a rising edge of clock 202), the value on valid data indicator 214 at the end of the previous clock cycle may be passed onto a staged valid data indicator 233.

An advantage of the incorporation of memory device 230 and additional memory device 232 into signature accumulator 200 is that the extra stages of delay may assist signature accumulator 200 in meeting timing requirements. Signature accumulator 200 may accordingly be easier to incorporate into a component.

Returning to the data path within signature accumulator 200, the K bits of first intermediate bus 235 are then passed to a commutative arithmetic operator 240, along with a K-bit signature bus 255. Commutative arithmetic operator 240 performs a commutative arithmetic operation between the value on first intermediate bus 235 and the value on signature bus 255. The commutative arithmetic operation may be addition, or multiplication, or any other commutative arithmetic operation. Commutative arithmetic operator 240 then places the result of the commutative arithmetic operation on a K-bit second intermediate bus 245.

Second intermediate bus 245 is thereafter input to a memory device 250, which may include a flip-flop or register, and which incorporates a clock input connected to clock 202 and an output connected to a K-bit signature bus 255. Memory device 250 also includes an enable input connected to staged valid data indicator 233. Accordingly, when staged valid data indicator 233 is '1,' and upon a predetermined stimulus on clock 202 (e.g. a rising edge), the value on second intermediate bus 245 is passed onto signature bus 255. Accordingly, signature bus 255 carries the previous value of second intermediate bus 245 (i.e., the value of second intermediate bus 245 at the end of the previous clock cycle). Signature bus 255 may then be passed to a register storage element to capture and preserve the value on signature bus 255 for further use (such as PCI configuration register reads or other register reads).

Finally, signature accumulator 200 has two clear-related inputs—a raw clear 206 and a clear override 207—as well an active-low reset-related input, asynchronous reset 209. An internal synchronous clear 209 will be set to '1' when either raw clear 206 or clear override 207 is set to '1.' Both memory device 230 and memory device 250 have synchronous clear inputs connected to synchronous clear 209, and asynchronous reset inputs connected to an inverted asynchronous reset 209. In various other embodiments, additional memory device 232 may also have a synchronous clear input connected to synchronous clear 209, an asynchronous reset input connected to the inverted asynchronous reset 209, or both.

As such, data compactor 220 compacts the N bits of input data 210 onto the K bits of additional bus 225. Then, either the K-bit data on additional bus 225 is latched by memory device 230 and placed upon first intermediate bus 235 on the next clock cycle (e.g., when enable 204 and raw valid data indicator 212 are both '1'), or memory device 230 retains and places the most recently latched value of additional bus 225 upon first intermediate bus 235. Commutative arithmetic operator 240 may then, for example, add the value on first intermediate bus 235 to the previous value on signature bus 255, and output the result onto second intermediate bus 245. Afterward, memory device 250 may capture the value on second intermediate bus 245 at the end of one clock cycle and place the value on signature bus 255 for the next clock cycle.

The value on signature bus 255 may then be captured by a memory device and, once all traffic has passed through the datapath, the value may be read out during an HVM test (by, e.g., a PCI configuration register read or other register read) to determine whether all expected transactions passed through the datapath. Since the addition operation (or other arithmetic operation) performed by commutative arithmetic operator 240 is commutative, after all traffic has passed through the datapath connected to input data 210, the value placed on signature bus 255 will be the same regardless of the order in which the traffic passed through the datapath. Actual silicon components may therefore be capable of passing this HVM test, even if the transactions have passed through the datapath in a different order than expected due to non-determinism in the HVM tester environment.

Figure 4:
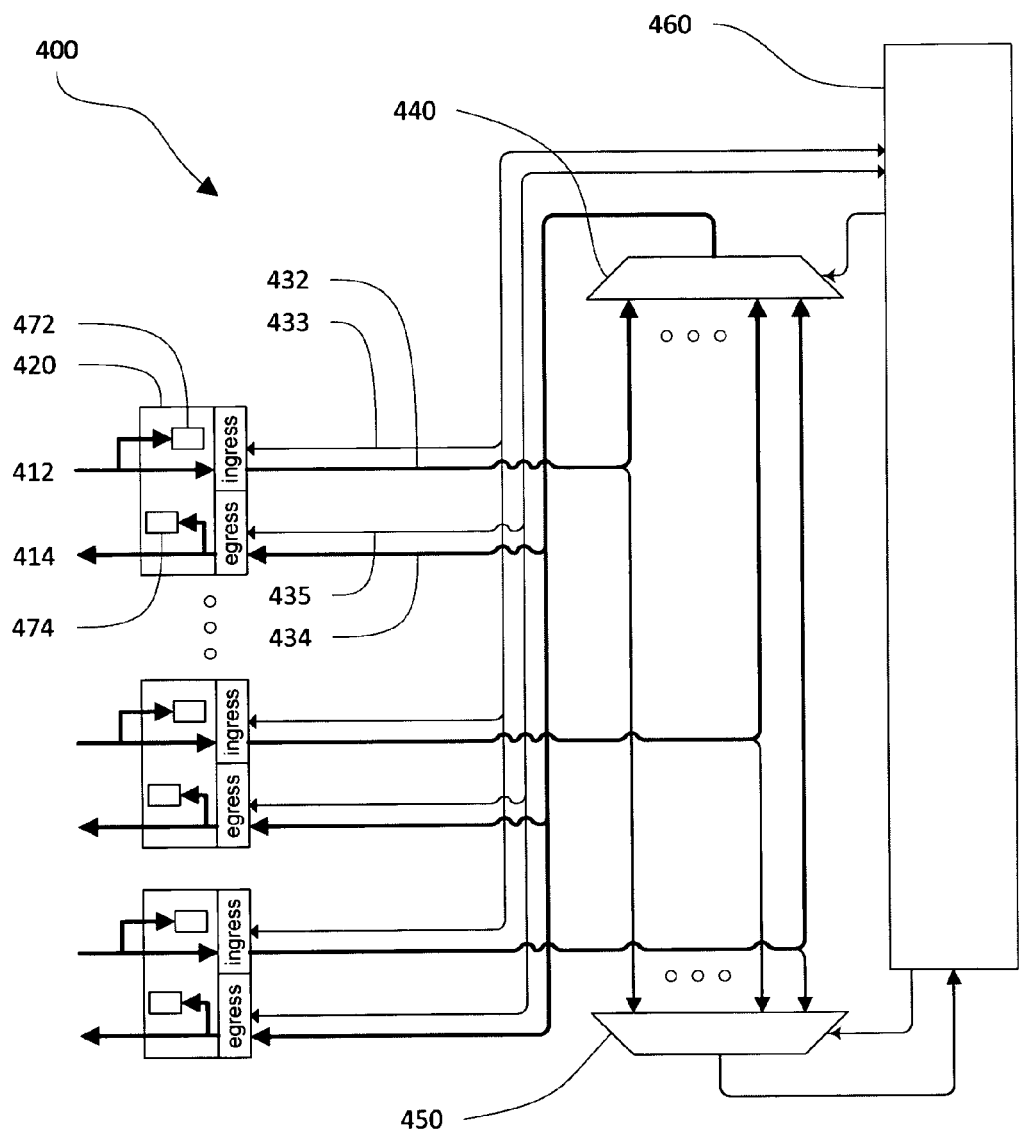
FIG. 4 illustrates a first fabric incorporating signature accumulators, according to some embodiments of the disclosure.

FIG. 4 illustrates a first fabric incorporating signature accumulators, according to some embodiments of the disclosure. A sideband fabric 400 includes a plurality of inbound datapaths 412 and a plurality of outbound datapaths 414, which are connected in pairs to a plurality of fabric ports 420. Each fabric port 420 includes ingress logic and egress logic. The internal sides of each fabric port 420 is connected to a separate ingress datapath bus 432 and an ingress control bus 433. Meanwhile, the internal sides of all of the fabric ports 420 are connected to an egress datapath bus 434 (which is shared among the ports) and an egress control bus 435.

Sideband fabric 400 also includes an outbound data multiplexer 440, an inbound ID multiplexer 450, and a set of routing arbitrators 460. Ingress control busses 433 exchange information about inbound traffic with routing arbiters 460 via the ingress control busses 433, which routing arbiters 460 use to maintain information about the traffic sent to the component. Based on that information, routing arbiters 460 select some of the bits of a transaction on one of the ingress datapath busses 432 to determine the destination fabric port 420 for the transaction. Routing arbiters 460 then select which of the ingress datapath busses 432 to connect to the egress datapath bus 434, and exchange information about outbound traffic with fabric ports 420 via the egress control busses 435.

In this context, each fabric port 420 includes an inbound signature accumulator 472 and an outbound signature accumulator 474. Inbound signature accumulators 472 are connected to the inbound datapaths 412, and outbound signature accumulators 474 are connected the outbound datapaths 414. In this configuration, signature accumulators may separately cover inbound traffic on the fabric and outbound traffic on the fabric for each port. Signature accumulators may be advantageously connected to individual ports of a fabric, such as individual ports of sideband fabric 400, when significant traffic is not expected to traverse centralized datapaths.

In various other embodiments, sideband fabric 400 may incorporate separate signature accumulators to cover each of a variety of traffic types passing through a particular datapath. For example, the inbound side of a fabric port 420 may include a separate inbound signature accumulator 472 for posted transactions, or for non-posted transactions, or for completion transactions, or for any combination thereof. Similarly, the outbound side of a fabric port 420 may include a separate outbound signature accumulator 474 for posted transactions, or for non-posted transactions, or for completion transactions, or for any combination thereof.

Figure 5:
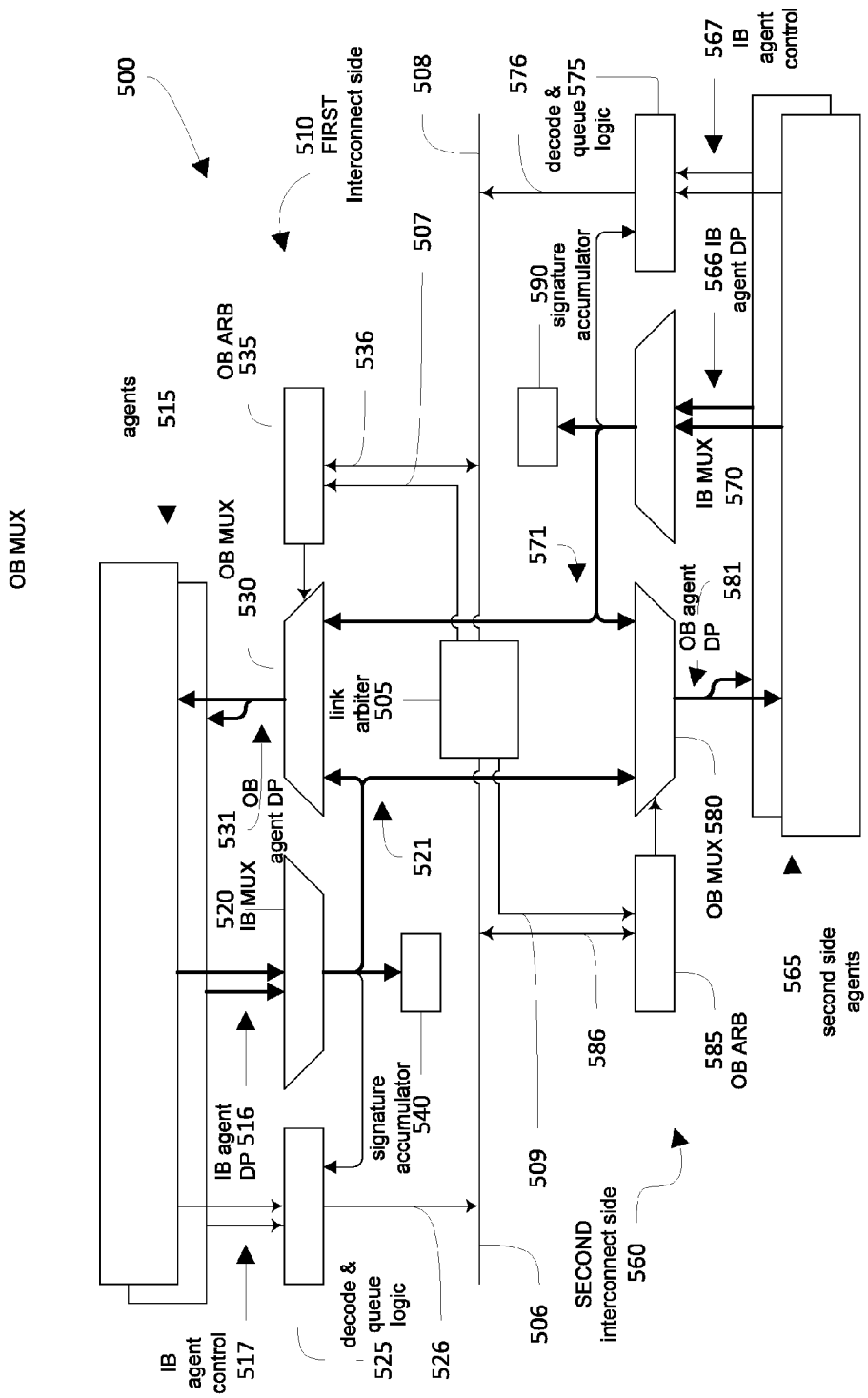
FIG. 5 illustrates a second fabric incorporating signature accumulators, according to some embodiments of the disclosure.

FIG. 5 illustrates a second fabric incorporating signature accumulators, according to some embodiments of the disclosure. A primary fabric 500 includes a first interconnect side 510, a second interconnect side 560, and a link arbiter 505. First interconnect side 510 and second interconnect side 560 have similar structures and interact with each other through link arbiter 505.

First interconnect side includes a plurality of first side agents 515, a first side inbound multiplexer 520, a first side inbound decode and queuing logic 525, a first side outbound multiplexer 530, and a first side outbound arbiter 535. Similarly, second interconnect side includes a plurality of second side agents 565, a second side inbound multiplexer 570, a second side inbound decode and queuing logic 575, a second side outbound multiplexer 580, and a second side outbound arbiter 585.

Each first side agent 515 transmits inbound traffic on a dedicated first side inbound agent datapath 516 to first side inbound multiplexer 520, and sends information regarding that agent's inbound traffic on a dedicated first side inbound agent control bus 517 to first side inbound decode and queuing logic 525. First side inbound multiplexer 520 routes data from one of the first side inbound agent datapaths 516 to a first side inbound datapath 521, which is an input to both first side outbound multiplexer 530 and second side outbound multiplexer 580. First side inbound multiplexer 520 also sends information to first side inbound decode and queuing logic 525, which in turn sends information to link arbiter 505 via a first side inbound request 526, which connects to a first request/grant bus 506.

Similarly, each second side agent 565 transmits inbound traffic on a dedicated second side inbound agent datapath 566 to second side inbound multiplexer 570, and sends information regarding that agent's inbound traffic on a dedicated second side inbound agent control bus 567 to second side inbound decode and queuing logic 575. Second side inbound multiplexer 570 routes data from one of the second side inbound agent datapaths 566 to a second side inbound datapath 571, which is an input to both first side outbound multiplexer 530 and second side outbound multiplexer 580. Second side inbound multiplexer 570 also sends information to second side inbound decode and queuing logic 575, which in turn sends information to link arbiter 505 via a second side inbound request 576, which connects to a second request/grant bus 508.

Link arbiter 505 coordinates with first side outbound arbiter 535 to handle outbound traffic on first interconnect side 510 via first link-arbiter-to-outbound-arbiter bus 507 and first side outbound grant 536. First side outbound arbiter 535 then selects to route either first side inbound datapath 521 (from first side inbound multiplexer 520) or second side inbound datapath 571 (from second side inbound multiplexer 570) to a first side outbound agent datapath 531, through first side outbound multiplexer 530.

Similarly, link arbiter 505 coordinates with second side outbound arbiter 585 to handle outbound traffic on second interconnect side 560 via second link-arbiter-to-outbound-arbiter bus 509 and second side outbound grant 586. Second side outbound arbiter 585 then selects to route either first side inbound datapath 521 (from first side inbound multiplexer 520) or second side inbound datapath 571 (from second side inbound multiplexer 570) to a second side outbound agent datapath 581, through second side outbound multiplexer 580.

In this context, first interconnect side 510 includes a first side signature accumulator 540 connected to first side inbound datapath 521, and second interconnect side 560 includes a second side signature accumulator 590 connected to second side inbound datapath 571. In this embodiment, one signature accumulator may cover inbound traffic from all first side agents 515, and another signature accumulator may cover inbound traffic from all second side agents 565. Signature accumulators may be advantageously connected to shared ports of a fabric, such as shared ports of primary fabric 500, when most of the traffic is expected to traverse centralized datapaths.

In various embodiments, signature accumulators may be integrated with any type of interconnect fabric. Various types of interconnect fabric may include an Intel® IOSF fabric (On-Chip System Fabric), an AMBA fabric (Advanced Microcontroller Bus Architecture), SoC-it fabric, or CoreConnect fabric. (Intel is a trademark of Intel Corporation in the U.S. and/or other countries.)

Incorporating a signature accumulator such as those described above into an SoC-based component may have various advantages. Such signature accumulators may advantageously permit functional HVM tests to cover potential defects or faults within the component when manufactured. If the signature accumulator is integrated within the design in such a way that the value on the signature bus is captured by registers accessible through PCI configuration register reads or other register reads targeting the component, then existing register access paths may be advantageously used to read out the value on the signature bus. In addition, register reads such as PCI configuration register reads may bypass much slower interfaces, such as register reads sent through a JTAG (Joint Test Action Group) test access port. Since the signature accumulators require a relatively small amount of logic, they can advantageously impose a relatively small cost on the component. At the same time, since the signature accumulators accommodate a measure of non-deterministic silicon performance on HVM testers, they can advantageously improve the reliability of functional HVM tests.

Figure 6:
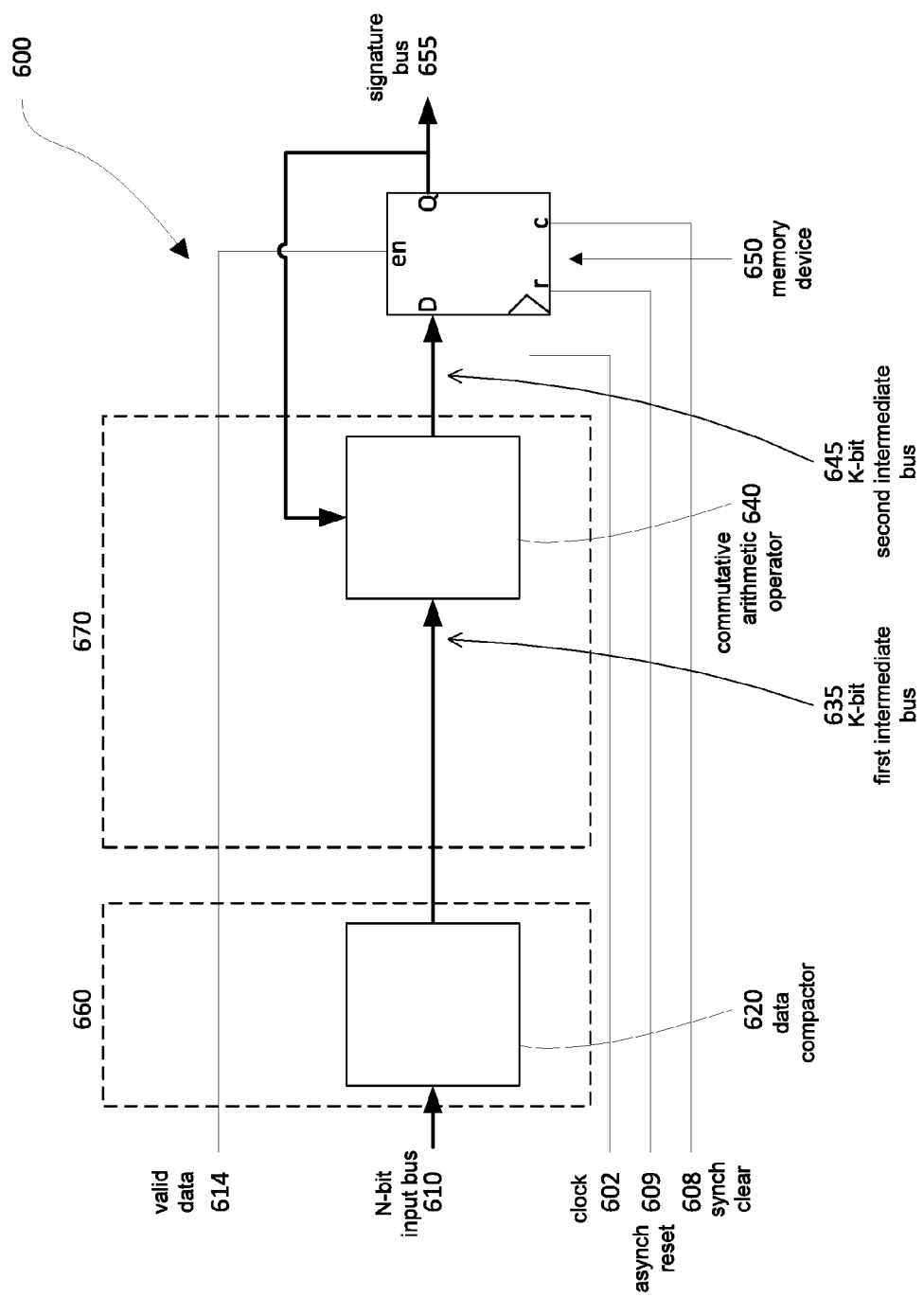
FIG. 6 illustrates a block diagram of a signature accumulator, according to some embodiments of the disclosure.

FIGS. 6-9 illustrate block diagrams of signature accumulators, according to some embodiments of the disclosure. With reference to FIG. 6, signature accumulator 600 has a number of input signal paths, including a clock 602, an input bus 610 having a number N of signal paths, and a valid-data input signal path 614. Signature accumulator 600 also includes a first intermediate bus 635 having a number K of signal paths, a second intermediate bus 645 having the number K of signal paths, and a signature bus 655 having the number K of signal paths.

Signature accumulator 600 incorporates a first set of logic devices 660 and a second set of logic devices 670. The first set of logic devices 660 includes compaction logic 620, which couples the N signal paths of input bus 610 to the K signal paths of first intermediate bus 645. The second set of logic devices 670 includes commutative arithmetic operation logic 640, which couples both the K signal paths of first intermediate bus 645 and the K signal paths of signature bus 655 to the K signal paths of second intermediate bus 645. Signature accumulator 600 also incorporates a memory device 650, which includes a storage element coupling the K signal paths of second intermediate bus 645 to the K signal paths of signature bus 655. Signature accumulator 600 also includes a synchronous clear signal 608 and an asynchronous reset signal 609, which are coupled to clear and reset inputs, respectively, of memory device 650.

In signature accumulator 600, signature bus 655 is coupled to the valid-data input signal path 614, through an enable input on memory device 650. In other embodiments, signature bus 655 may be coupled to the valid-data input signal path 614 through first intermediate bus 645, such as by making the value on input bus 610 conditional upon the valid-data input signal path 614 being set to '1.' Signature accumulator 600 may also include a register memory having an input coupled to signature bus 655. For example, signature accumulator 600 may be incorporated within an interconnect fabric and coupled to one or more ports within the interconnect fabric by datapaths associated with the one or more ports. Such a register memory may be within an address space of associated with the one or more ports.

Signature accumulator 600 may thus include a first logic, a second logic, and a storage unit. The first logic may have an input coupled to input bus 610 and an output coupled to first intermediate bus 635, for which the first logic is operable to perform a compaction operation on the bits of the input bus. The second logic may have a first input coupled to first intermediate bus 635, a second input coupled to signature bus 655, and an output coupled to second intermediate bus 645, for which the second logic is operable to perform a commutative arithmetic operation between first intermediate bus 635 and signature bus 655. The storage unit may have an input coupled to second intermediate bus 645 and an output coupled to signature bus 655, for which the storage unit includes memory devices operable to store the K bits of data on second intermediate bus 645.

Figure 8:
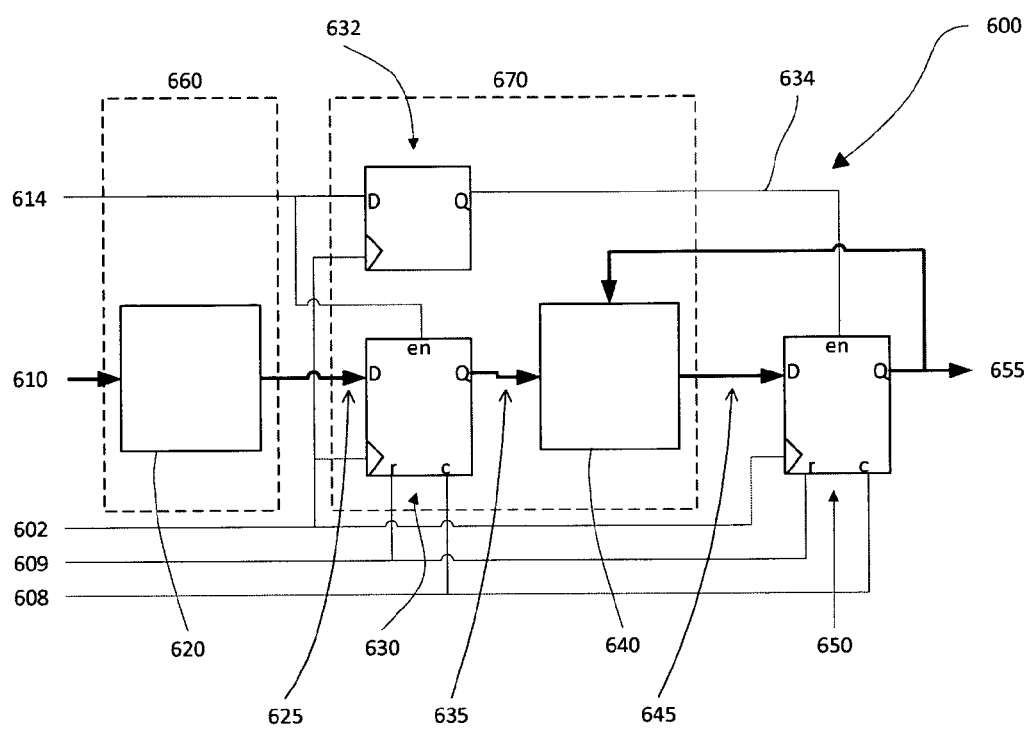
FIG. 8 illustrates a block diagram of a signature accumulator, according to some embodiments of the disclosure.

FIG. 8 includes structures substantially similar to those in FIG. 6, but also —includes an additional bus 625 having a number K of signal paths. Furthermore, the second set of logic devices 670 includes an additional memory device 632 and another additional memory device 630. Memory device 632 has a first additional storage element that couples valid-data input signal path 614 to the enable input of memory device 650 via a staged valid data indicator 634.

Memory device 630 has a second additional storage element that couples the K signal paths of additional bus 625 to the K signal paths of first intermediate bus 635.

Signature accumulator 600 may thus include an additional bus 625 and a first additional storage unit coupling the enable input of the storage unit to the valid-data input signal path 614. The second logic may include a second additional storage element coupling first intermediate bus 635 to additional bus 625.

Figure 7:
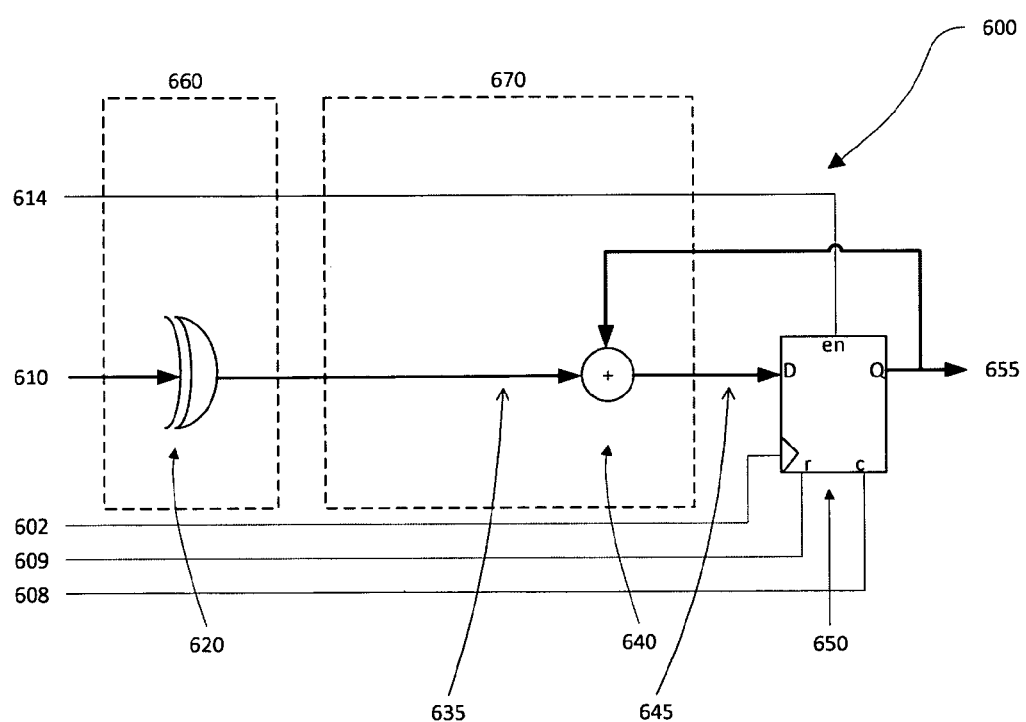
FIG. 7 illustrates a block diagram of a signature accumulator, according to some embodiments of the disclosure.
Figure 9:
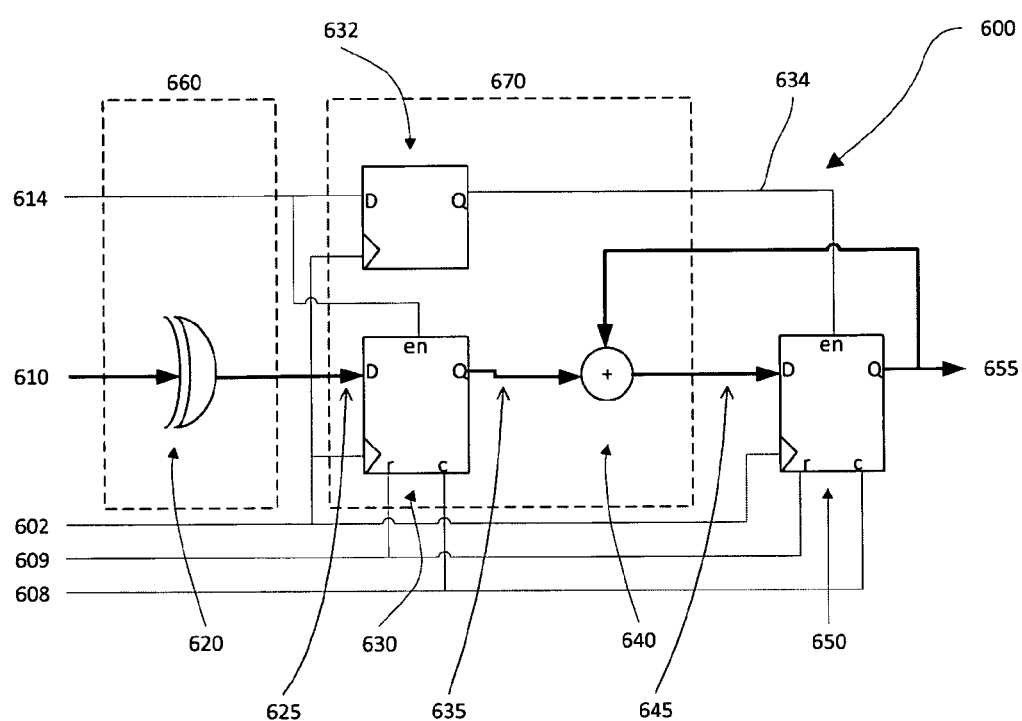
FIG. 9 illustrates a block diagram of a signature accumulator, according to some embodiments of the disclosure.

In the embodiments illustrated in FIGS. 7 and 9, compaction logic 620 is an XOR tree incorporating a number S of stages of XOR logic (as discussed above with respect to FIG. 3). In addition, commutative arithmetic operation logic 640 performs an addition operation.

Figure 10:
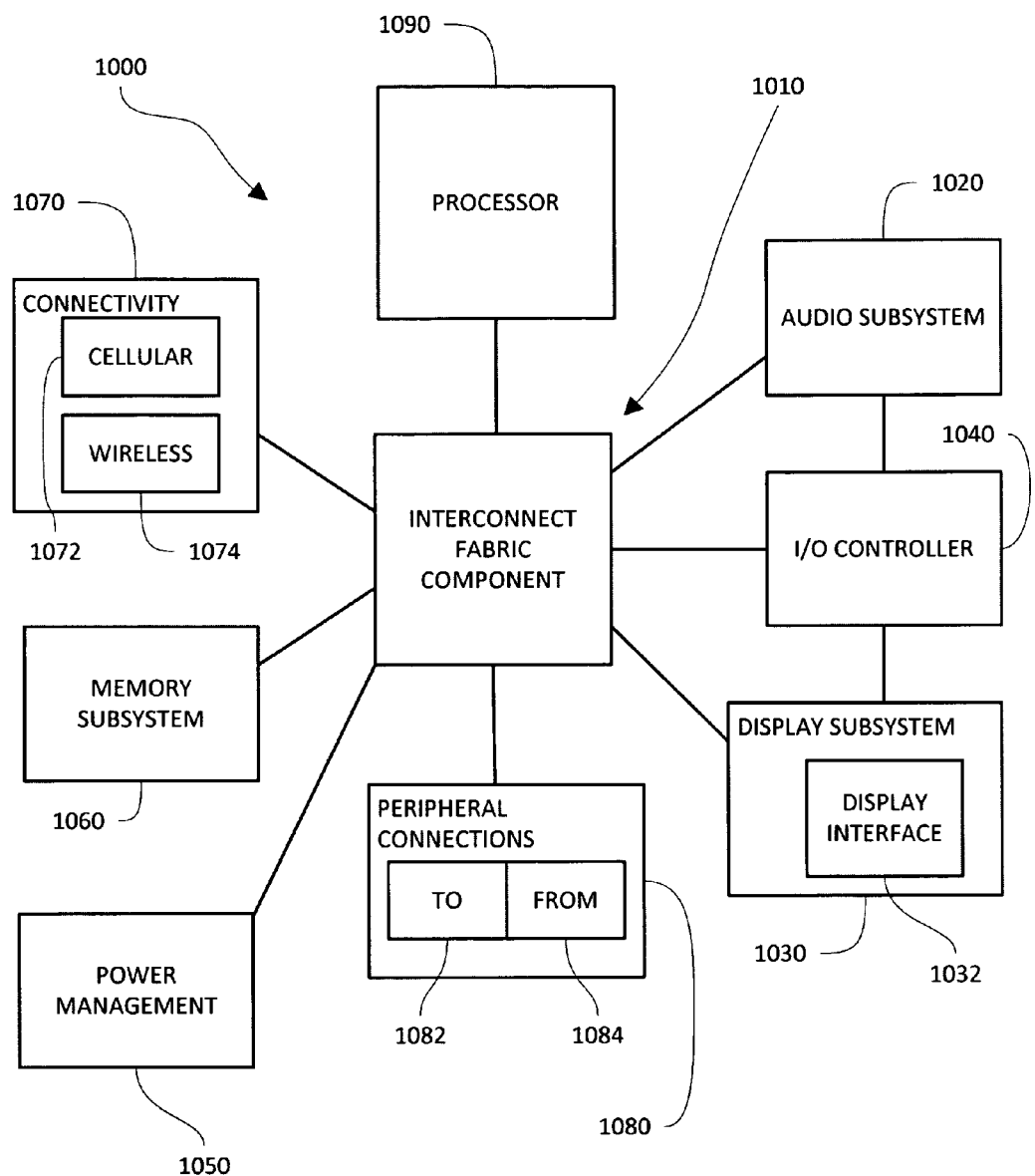
FIG. 10 illustrates a system incorporating a component having a signature accumulator, according to some embodiments of the disclosure.

FIG. 10 illustrates a system incorporating a component having a signature accumulator, according to some embodiments of the disclosure. More particularly, FIG. 10 illustrates a block diagram of an embodiment of an SoC in which signature accumulators are used. In some embodiments, system 1000 represents a mobile computing device, such as a computing tablet, a mobile phone or smart-phone, a wireless-enabled e-reader, or other wireless mobile device.

It will be understood that certain components are shown generally, and not all components of such a device are shown in system 1000. In addition, in various embodiments, system 1000 may be an SoC, or a computer system, or a smart device. Moreover, while some of the components may be physically separate, others may be integrated within the same physical package, or even on the same physical silicon die. Accordingly, the separation between the various components as depicted in FIG. 10 may not be physical in some cases, but may instead be a functional separation.

In some embodiments, system 1000 includes an interconnect fabric component 1010 having a number of ports connected to other components in system 1000. One or more of the ports has a signature accumulator connected to a datapath associated with that port.

System 1000 includes a processor 1090, which may be a general-purpose processor or CPU (Central Processing Unit). In some embodiments, processor 1090 can include one or more physical devices, such as microprocessors, application processors, microcontrollers, programmable logic devices, or other processing means. The processing operations performed by processor 1090 may include the execution of an operating platform or operating system on which applications and/or device functions may then be executed. The processing operations may also include operations related to one or more of the following: I/O (input/output) with a human user or with other devices; power management; connecting system 1000 to another device; audio I/O; and/or display I/O.

In some embodiments, system 1000 includes an audio subsystem 1020, which represents hardware components (e.g., audio hardware and audio circuits) and software components (e.g., drivers and codecs) associated with providing audio functions to system 1000. Audio functions can include speaker and/or headphone output as well as microphone input. Devices for such functions can be integrated into system 1000 or connected to system 1000. In one embodiment, a user interacts with system 1000 by providing audio commands that are received and processed by processor 1090.

In some embodiments, system 1000 includes a display subsystem 1030. Display subsystem 1030 represents hardware components (e.g., display devices) and software components (e.g., drivers) that provide a visual and/or tactile display for a user to interact with the system 1000. Display subsystem 1030 may include a display interface 1032, which may be a particular screen or hardware device used to provide a display to a user. In one embodiment, display interface 1032 includes logic separate from processor 1090 to perform at least some processing related to the display. In some embodiments, display subsystem 1030 includes a touch screen (or touch pad) device that provides both output and input to a user.

In some embodiments, system 1000 includes an I/O controller 1040 associated with hardware devices and software components related to interaction with a user. I/O controller 1040 is operable to manage hardware that is part of audio subsystem 1020 and/or display subsystem 1030. Additionally, I/O controller 1040 may be a connection point for additional devices that connect to system 1000, through which a user might interact with the system. For example, devices that can be attached to the system 1000 might include microphone devices, speaker or stereo systems, video systems or other display devices, keyboard or keypad devices, or other I/O devices for use with specific applications such as card readers or other devices.

As mentioned above, I/O controller 1040 can interact with audio subsystem 1020 and/or display subsystem 1030. For example, input through a microphone or other audio device can provide input or commands for one or more applications or functions of system 1000. Additionally, audio output can be provided instead of, or in addition to, display output. In another example, if display subsystem 1030 includes a touch screen, the display device may also act as an input device, which can be at least partially managed by I/O controller 1040. There can also be additional buttons or switches on system 1000 to provide I/O functions managed by I/O controller 1040.

In some embodiments, I/O controller 1040 manages devices such as accelerometers, cameras, light sensors or other environmental sensors, or other hardware that can be included in system 1000. The input can be part of direct user interaction, and may provide environmental input to the system to influence its operations (such as filtering for noise, adjusting displays for brightness detection, applying a flash for a camera, or other features).

In some embodiments, system 1000 includes a power management component 1050 that manages battery power usage, charging of the battery, and features related to power saving operation.

A memory subsystem 1060 includes memory devices for storing information in system 1000, coupled to processor 1090. Memory subsystem 1060 can include nonvolatile memory devices (whose state does not change if power to the memory device is interrupted) and/or volatile memory devices (whose state is indeterminate if power to the memory device is interrupted). Memory subsystem 1060 can store application data, user data, music, photos, documents, or other data, as well as system data (whether long-term or temporary) related to the execution of the applications and functions of system 1000.

Some portion of memory subsystem 1060 may also be provided as a non-transitory machine-readable medium for storing the computer-executable instructions (e.g., instructions to implement any other processes discussed herein). The machine-readable medium may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, system 1000 includes a network interface within a connectivity component 1070, such as a cellular interface 1072 or a wireless interface 1074, so that a system embodiment may be incorporated into a wireless device such as a cell phone or personal digital assistant. In some embodiments, connectivity component 1070 includes hardware devices (e.g., wireless and/or wired connectors and communication hardware) and software components (e.g., drivers or protocol stacks) to enable system 1000 to communicate with external devices. System 1000 could include separate devices, such as other computing devices, wireless access points or base stations, as well as peripherals such as headsets, printers, or other devices.

In some embodiments, connectivity component 1070 can include multiple different types of network interfaces, such as one or more wireless interfaces for allowing processor 1090 to communicate with another device. To generalize, system 1000 is illustrated with cellular connectivity 1072 and wireless connectivity 1074. Cellular connectivity 1072 refers generally to wireless interfaces such as cellular network connectivity provided by wireless carriers, such as provided via GSM or variations or derivatives, CDMA (code division multiple access) or variations or derivatives, TDM (time division multiplexing) or variations or derivatives, or other cellular service standards. Wireless interface 1074 refers generally to wireless interfaces that are not cellular, and can include personal area networks (such as Bluetooth, Near Field, etc.), local area networks (such as Wi-Fi), and/or wide area networks (such as WiMax), or other wireless communication.

In some embodiments, system 1000 has various peripheral connections 1080. Peripheral connections 1080 may include hardware interfaces and connectors, as well as software components (e.g., drivers, protocol stacks) to make peripheral connections. It will be understood that system 1000 could both be a peripheral device to other computing devices (via "to" 1082), as well as have peripheral devices connected to it (via "from" 1084). System 1000 may have a "docking" connector to connect to other computing devices for purposes such as managing content on system 1000 (e.g., downloading and/or uploading, changing, synchronizing). Additionally, a docking connector can allow system 1000 to connect to certain peripherals that allow system 1000 to control content output, for example, to audiovisual or other systems.

In addition to a proprietary docking connector or other proprietary connection hardware, system 1000 can make peripheral connections 1080 via common or standards-based connectors. Common types of connectors can include a Universal Serial Bus (USB) connector (which can include any of a number of different hardware interfaces), a DisplayPort or MiniDisplayPort (MDP) connector, a High Definition Multimedia Interface (HDMI) connector, a Firewire connector, or other types of connectors.

Figure 11:
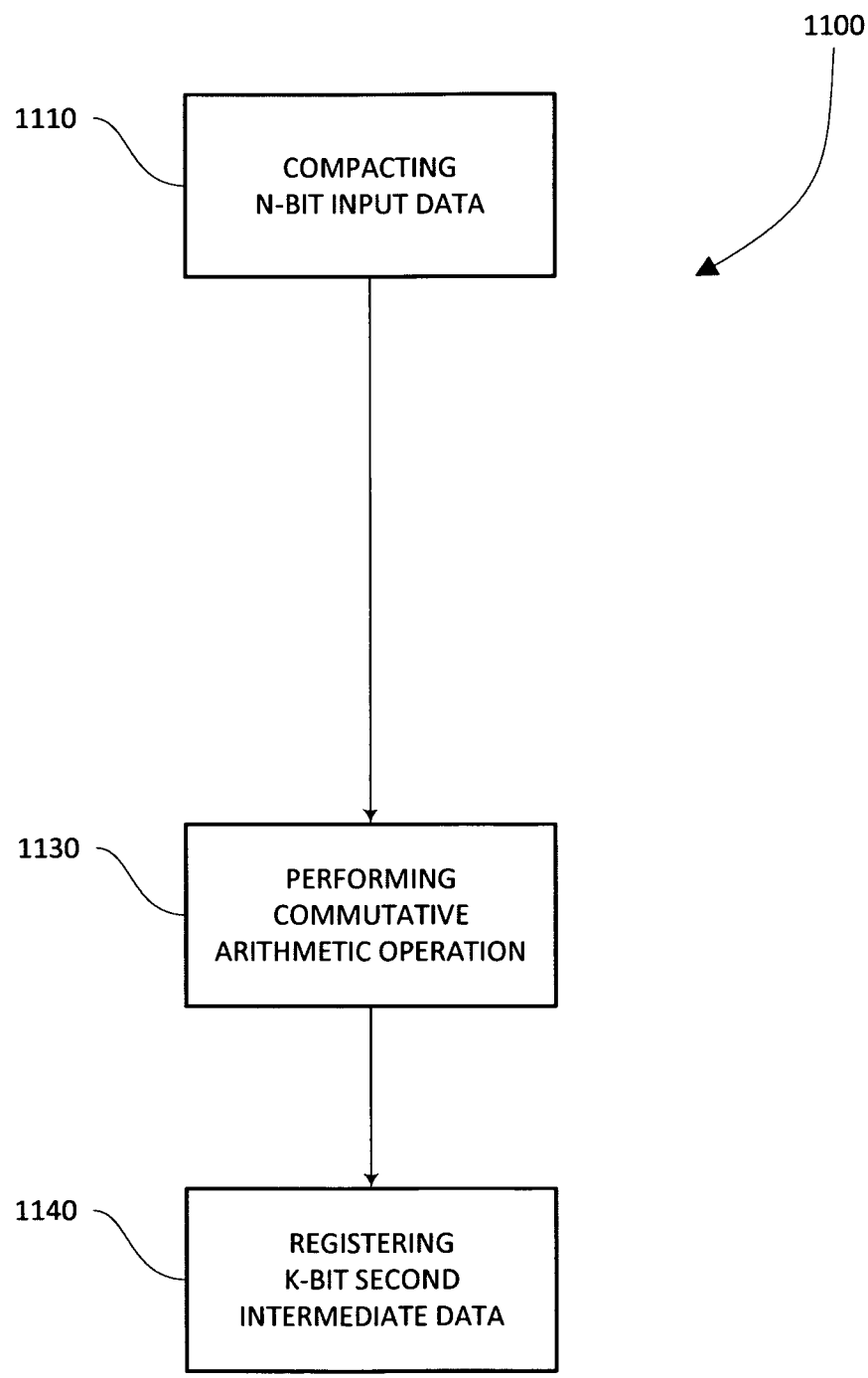
FIG. 11 illustrates a method of accumulating a signature, according to some embodiments of the disclosure.
Figure 12:
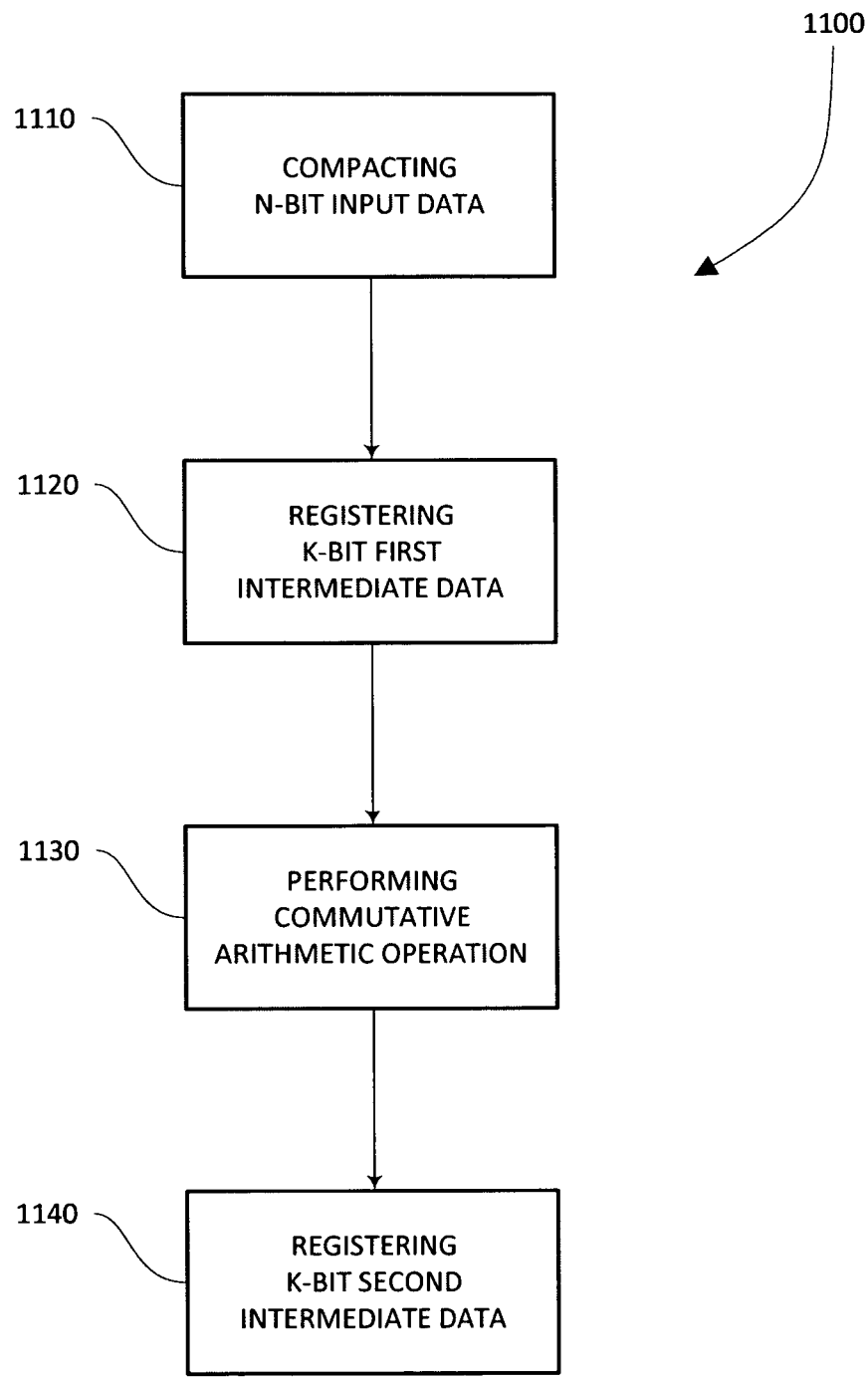
FIG. 12 illustrates a method of accumulating a signature, according to some embodiments of the disclosure.

FIGS. 11 and 12 illustrate methods of accumulating a signature, according to some embodiments of the disclosure. Although the blocks in the flowchart with reference to FIGS. 11 and 12 are shown in a particular order, the order of the actions can be modified. Thus, the illustrated embodiments can be performed in a different order, and some actions/blocks may be performed in parallel. Some of the blocks and/or operations listed in FIGS. 11 and 12 are optional in accordance with certain embodiments. The numbering of the blocks presented is for the sake of clarity and is not intended to prescribe an order of operations in which the various blocks must occur. Additionally, operations from the various flows may be utilized in a variety of combinations.

With reference to FIG. 11, a method 1100 may include a compacting 1110 of N-bit input data, a performing 1130 of a commutative arithmetic operation, and a registering 1140 of K-bit second intermediate data. More particularly, in compacting 1110, an N-bit input data may be compacted to generate a K-bit first intermediate data. Then, in performing 1130, a commutative arithmetic operation may be performed between the K-bit first intermediate data and a K-bit signature data to generate a K-bit second intermediate data. Finally, in registering 1140, the K-bit second intermediate data may be registered to generate the K-bit signature data, wherein a valid data signal is coupled to the K-bit signature data.

With reference to FIG. 12, in some embodiments, method 1100 may additionally include a registering 1120 of K-bit first intermediate data. More particularly, in registering 1120, the K-bit first intermediate data may be registered to generate a K-bit registered first intermediate data. In some embodiments, a valid-data signal may also be registered to generate a registered valid-data signal.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics disclosed may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

In one example, an apparatus is provided which may comprise: an input bus having a number N of signal paths, a valid-data input signal path, a first intermediate bus having a number K of signal paths, a second intermediate bus having the number K of signal paths, a signature bus having the number K of signal paths, a first set of logic devices, a second set of logic devices, and a memory device. The first set of logic devices may include compaction logic coupling the N signal paths of the input bus to the K signal paths of the first intermediate bus. The second set of logic devices may include commutative arithmetic operation logic coupling both the K signal paths of the first intermediate bus and the K signal paths of the signature bus to the K signal paths of the second intermediate bus. The memory device may include a storage element coupling the K signal paths of the second intermediate bus to the K signal paths of the signature bus. The signature bus may be coupled to the valid-data input signal path.

In some embodiments, the compaction logic may include at least one stage of XOR logic. In some embodiments, the commutative arithmetic operation logic may include adder logic. In some embodiments, the ratio of N to K may be a power of two. In some embodiments, the apparatus may comprise a register memory having an input coupled to the signature bus. In some embodiments, the register memory may be within an address space of a port within the interconnect fabric.

In some embodiments, the apparatus may comprise an additional bus and an additional memory device. The additional bus may have the number K of signal paths. The additional memory device may include a first additional storage element coupling the enable input of the memory device to the valid-data input signal path. The second set of logic devices may include a second additional storage element coupling the K signal paths of the first intermediate bus to the K signal paths of the additional bus. The commutative arithmetic logic may couple the K signal paths of the additional bus and the K signal paths of the signature bus to the K signal paths of the second intermediate bus. In some embodiments, the apparatus may be coupled to at least two ports within an interconnect fabric.

In another example, an apparatus is provided which may comprise: a first logic, a second logic, and a storage unit. The first logic may have an input coupled to an input bus and an output coupled to a first intermediate bus, and the first logic may be operable to perform a compaction operation on the bits of the input bus. The second logic may have a first input coupled to the first intermediate bus, a second input coupled to a signature bus, and an output coupled to a second intermediate bus, and the second logic may be operable to perform a commutative arithmetic operation between the first intermediate bus and the signature bus. The storage unit may have an input coupled to the second intermediate bus and an output coupled to the signature bus, and the storage unit may include memory devices operable to store K bits of data on the second intermediate bus. The signature bus may be coupled to a valid-data input.

In some embodiments, the compaction operation may include at least one stage of XOR operations. In some embodiments, the commutative arithmetic operation may be an addition operation. In some embodiments, the input bus may have a width of N bits, the first intermediate bus may have a width of K bits, the second intermediate bus may have a width of K bits, and the third intermediate bus may have a width of K bits. In some embodiments, the ratio of N to K may be a power of two. Some embodiments may comprise a register memory having an input coupled to the signature bus. In some embodiments, the register memory may be within an address space of the port within the interconnect fabric.

In some embodiments, the apparatus may comprise an additional bus and a first additional storage unit. The first additional storage unit may couple the enable input of the storage unit to the valid-data input. The second logic may include a second additional storage element coupling the first intermediate bus to the additional bus. The second logic may be operable to perform a commutative arithmetic operation between the additional bus and the signature bus.

In another example, a system is provided which may comprise a memory, a processor coupled to the memory, and a wireless interface for allowing the processor to communicate with another device, the processor including any of the exemplary apparatus described above.

In another example, a system is provided which may comprise: a memory, a processor coupled to the memory, and a wireless interface for allowing the processor to communicate with another device. The processor may include an input bus, a first set of logic devices, a second set of logic devices, and a memory device. The input bus may have a number N of signal paths, a valid-data input signal path, a first intermediate bus having a number K of signal paths, a second intermediate bus having the number K of signal paths, and a signature bus having the number K of signal paths. The first set of logic devices may include compaction logic coupling the N signal paths of the input bus to the K signal paths of the first intermediate bus. The second set of logic devices may include commutative arithmetic operation logic coupling both the K signal paths of the first intermediate bus and the K signal paths of the signature bus to the K signal paths of the second intermediate bus. The memory device may include a storage element coupling the K signal paths of the second intermediate bus to the K signal paths of the signature bus. The signature bus may be coupled to the valid-data input signal path.

In some embodiments, the compaction logic may include at least one stage of XOR logic, and the commutative arithmetic operation logic may include adder logic. In some embodiments, the ratio of N to K may be a power of two.

In some embodiments, the system may comprise an additional bus and an additional memory device. The additional bus may have the number K of signal paths. The additional memory device may include a first additional storage element coupling the enable input of the memory device to the valid-data input signal path. The second set of logic devices may include a second additional storage element coupling the K signal paths of the first intermediate bus to the K signal paths of the additional bus. The commutative arithmetic logic may couple the K signal paths of the additional bus and the K signal paths of the signature bus to the K signal paths of the second intermediate bus.

In another example, a method is provided which may comprise: compacting an N-bit input data to generate a K-bit first intermediate data; registering the K-bit first intermediate data to generate a K-bit registered first intermediate data;

registering a valid-data signal to generate a registered valid-data signal; performing a commutative arithmetic operation between the K-bit registered first intermediate data and a K-bit signature data to generate a K-bit second intermediate data; and registering the K-bit second intermediate data to generate the K-bit signature data, wherein a valid data signal is coupled to the K-bit signature data.

In some embodiments, the compaction may include one or more stages of XOR operations. In some embodiments, the commutative arithmetic operation may be an addition operation. In some embodiments, the ratio of N to K may be a power of two. In some embodiments, the K-bit signature data may be registered in a register memory within an address space of a port within an interconnect fabric.

In another example, machine readable storage media having machine executable instructions stored thereon are provided. The instructions, when executed, may cause one or more processors to perform a method according to any of the exemplary methods discussed above.

In another example, machine readable storage media having machine executable instructions stored thereon are provided. The instructions, when executed, may cause one or more processors to perform an operation comprising: compact an N-bit input data to generate a K-bit first intermediate data; register the K-bit first intermediate data to generate a K-bit registered first intermediate data; register a valid-data signal to generate a registered valid-data signal; perform a commutative arithmetic operation between the K-bit registered first intermediate data and a K-bit signature data to generate a K-bit second intermediate data; and register the K-bit second intermediate data to generate the K-bit signature data, wherein a valid data signal is coupled to the K-bit signature data.

In some embodiments, the compaction may include one or more stages of XOR operations. In some embodiments, the commutative arithmetic operation may be an addition operation. In some embodiments, the ratio of N to K may be a power of two. In some embodiments, the K-bit signature data may be registered in a register memory within an address space of a port within an interconnect fabric.

In another example, an apparatus may comprise: means for compacting an N-bit input data to generate a K-bit first intermediate data; means for registering the K-bit first intermediate data to generate a K-bit registered first intermediate data; means for registering a valid-data signal to generate a registered valid-data signal; means for performing a commutative arithmetic operation between the K-bit registered first intermediate data and a K-bit signature data to generate a K-bit second intermediate data; and means for registering the K-bit second intermediate data to generate the K-bit signature data, wherein a valid data signal is coupled to the K-bit signature data.

In some embodiments, the means for compacting may include one or more stages of XOR operations. In some embodiments, the commutative arithmetic operation may be an addition operation. In some embodiments, the ratio of N to K may be a power of two. In some embodiments, the K-bit signature data may be registered in a register memory within an address space of a port within an interconnect fabric.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
    an input bus having a number N of signal paths, a valid-data input signal path, a first intermediate bus having a number K of signal paths, a second intermediate bus having the number K of signal paths, and a signature bus having the number K of signal paths;
    a first set of logic devices including compaction logic coupling the N signal paths of the input bus to the K signal paths of the first intermediate bus;
    a second set of logic devices including commutative arithmetic operation logic coupling both the K signal paths of the first intermediate bus and the K signal paths of the signature bus to the K signal paths of the second intermediate bus; and
    a memory device including a storage element coupling the K signal paths of the second intermediate bus to the K signal paths of the signature bus,
    wherein the signature bus is coupled to the valid-data input signal path.

2. The apparatus of claim 1, wherein the compaction logic includes at least one stage of XOR logic.

3. The apparatus of claim 1, wherein the ratio of N to K is a power of two.

4. The apparatus of claim 1, comprising a register memory having an input coupled to the signature bus.

5. The apparatus of claim 4, wherein the register memory is within an address space of a port within the interconnect fabric.

6. The apparatus of claim 1, comprising:
    an additional bus having the number K of signal paths; and
    an additional memory device including a first additional storage element coupling an enable input of the memory device to the valid-data input signal path,
    wherein the second set of logic devices includes a second additional storage element coupling the K signal paths of the first intermediate bus to the K signal paths of the additional bus; and
    wherein the commutative arithmetic logic couples the K signal paths of the additional bus and the K signal paths of the signature bus to the K signal paths of the second intermediate bus.

7. The apparatus claim 1, wherein the apparatus is coupled to at least two ports within an interconnect fabric.

8. An apparatus comprising:
    a first logic having an input coupled to an input bus and an output coupled to a first intermediate bus, the first logic being operable to perform a compaction operation on the bits of the input bus;
    a second logic having a first input coupled to the first intermediate bus, a second input coupled to a signature bus, and an output coupled to a second intermediate bus, the second logic being operable to perform a commutative arithmetic operation between the first intermediate bus and the signature bus; and
    a storage unit having an input coupled to the second intermediate bus and an output coupled to the signature bus, the storage unit including memory devices operable to store K bits of data on the second intermediate bus,
    wherein the signature bus is coupled to a valid-data input.

9. The apparatus of claim 8, wherein the compaction operation includes at least one stage of XOR operations.

10. The apparatus of claim 9, wherein the commutative arithmetic operation is an addition operation.

11. The apparatus of claim 10, wherein the input bus has a width of N bits, the first intermediate bus has a width of K bits, the second intermediate bus has a width of K bits, and the third intermediate bus has a width of K bits.

12. The apparatus of claim 11, wherein the ratio of N to K is a power of two.

13. The apparatus of claim 12, comprising a register memory having an input coupled to the signature bus.

14. The apparatus of claim 13, wherein the register memory is within an address space of a port within the interconnect fabric.

15. The apparatus of claim 14 comprising:
an additional bus; and
a first additional storage unit coupling an enable input of the storage unit to the valid-data input,
wherein the second logic includes a second additional storage element coupling the first intermediate bus to the additional bus; and
wherein the second logic is operable to perform a commutative arithmetic operation between the additional bus and the signature bus.

16. A system comprising a memory, a processor coupled to the memory, and a wireless interface for allowing the processor to communicate with another device, the processor including:
an input bus having a number N of signal paths, a valid-data input signal path, a first intermediate bus having a number K of signal paths, a second intermediate bus having the number K of signal paths, and a signature bus having the number K of signal paths;
a first set of logic devices including compaction logic coupling the N signal paths of the input bus to the K signal paths of the first intermediate bus;
a second set of logic devices including commutative arithmetic operation logic coupling both the K signal paths of the first intermediate bus and the K signal paths of the signature bus to the K signal paths of the second intermediate bus; and
a memory device including a storage element coupling the K signal paths of the second intermediate bus to the K signal paths of the signature bus,
wherein the signature bus is coupled to the valid-data input signal path.

17. The system of claim 16, wherein the ratio of N to K is a power of two.

18. The system of claim 16, comprising:
an additional bus having the number K of signal paths; and
an additional memory device including a first additional storage element coupling an enable input of the memory device to the valid-data input signal path,
wherein the second set of logic devices includes a second additional storage element coupling the K signal paths of the first intermediate bus to the K signal paths of the additional bus; and
wherein the commutative arithmetic logic couples the K signal paths of the additional bus and the K signal paths of the signature bus to the K signal paths of the second intermediate bus.

19. The apparatus of claim 1, wherein the commutative arithmetic operation logic is operable to perform a commutative arithmetic operation between a value on the K signal paths of the first intermediate bus and a value on the K signal paths of the signature bus.

20. The system of claim 16, wherein the commutative arithmetic operation logic is operable to perform a commutative arithmetic operation between a value on the K signal paths of the first intermediate bus and a value on the K signal paths of the signature bus.

* * * * *